(12) United States Patent
Qi et al.

(10) Patent No.: US 10,229,963 B1
(45) Date of Patent: Mar. 12, 2019

(54) DISPLAY DEVICE INCLUDING SUPPORT STRUCTURE FOR BENDING

(71) Applicant: Google LLC, Mountain View, CA (US)

(72) Inventors: Qi Qi, Mountain View, CA (US); Ken Foo, Sunnyvale, CA (US); Yi Tao, Mountain View, CA (US); John Kaehler, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/800,602

(22) Filed: Nov. 1, 2017

(51) Int. Cl.
| H05K 1/00 | (2006.01) |
| H01L 27/32 | (2006.01) |
| H05K 1/18 | (2006.01) |
| H05K 1/14 | (2006.01) |
| H05K 1/02 | (2006.01) |
| H01L 51/52 | (2006.01) |

(52) U.S. Cl.
CPC ......... *H01L 27/3276* (2013.01); *H05K 1/028* (2013.01); *H05K 1/147* (2013.01); *H05K 1/181* (2013.01); *H01L 51/5237* (2013.01); *H01L 2251/5338* (2013.01); *H05K 2201/041* (2013.01); *H05K 2201/055* (2013.01); *H05K 2201/056* (2013.01); *H05K 2201/10128* (2013.01)

(58) Field of Classification Search
CPC ......... H01L 2251/5338; H01L 27/3246; H01L 27/3258; H01L 27/3276; H01L 51/0097; H01L 2227/323; H01L 25/167; H01L 27/3297; H01L 51/5253; H01L 51/56; H01L 2251/5315; H01L 27/3211; H01L 27/323
See application file for complete search history.

(56) References Cited

U.S. PATENT DOCUMENTS

| 2010/0302478 | A1* | 12/2010 | Nakagawa | G02B 6/0091 349/62 |
| 2013/0242209 | A1 | 9/2013 | Takaki et al. | |
| 2014/0240985 | A1* | 8/2014 | Kim | H05K 1/028 362/249.04 |
| 2014/0307396 | A1* | 10/2014 | Lee | H05K 1/028 361/749 |
| 2016/0172623 | A1* | 6/2016 | Lee | H01L 51/5253 257/40 |
| 2016/0181346 | A1* | 6/2016 | Kwon | H01L 27/3276 257/40 |

(Continued)

OTHER PUBLICATIONS

International Search Report and Written Opinion for International Application No. PCT/US2018/045772, dated Nov. 20, 2018, 14 pages.

*Primary Examiner* — Yuriy Semenenko
(74) *Attorney, Agent, or Firm* — Brake Hughes Bellermann LLP

(57) ABSTRACT

In a general aspect, a display device may include a flexible display having a substantially flat central portion and an end portion, a printed circuit film disposed on the end portion of the display, a panel member attached to the printed circuit film, the panel member being bent around a bend axis to form an edge of the display, and a support structure disposed inside of formed edge of the panel member, the support structure being non-parallel to the flat central portion of the display. The panel member may conform to a shape of the support structure.

20 Claims, 6 Drawing Sheets

(56) References Cited

U.S. PATENT DOCUMENTS

2016/0204183 A1* 7/2016 Tao .................... H01L 51/0097
                                                            257/40
2016/0293869 A1* 10/2016 Saeki ................. H01L 51/0097

\* cited by examiner

DISPLAY DEVICE INCLUDING SUPPORT STRUCTURE FOR BENDING

TECHNICAL FIELD

This disclosure relates generally to display devices, and, more particularly, to display devices that include a support structure for bending.

BACKGROUND

Displays employed in electronic devices (e.g., cellular phones, portable computing devices, etc.) may be formed of a flexible substrate. To minimize a border size of the display, the flexible substrate may be bent at its edge.

SUMMARY

In a general aspect, a display device may include a flexible display having a substantially flat central portion and an end portion, a printed circuit film disposed on the end portion of the display, a panel member attached to the printed circuit film, the panel member being bent around a bend axis to form an edge of the display, and a support structure disposed inside of formed edge of the panel member, the support structure being non-parallel to the flat central portion of the display. The panel member may conform to a shape of the support structure.

Implementations can include one or more of the following features. For example, the support member may include a tapered portion. The shape of the support structure may be trapezoidal. The support structure may include a first side and a second side, in which the first side may be linear and the second side may be non-linear. The non-linear surface may be curved. The support structure may be formed of a plastic material. The support structure may be formed of a metal material. The support structure may be formed of foam. In some implementations, the display device may include an adhesive between the panel member and the support structure. The adhesive may be a pressure-sensitive adhesive. In some implementations, the display device may include a coating layer disposed on an outer side of the panel member to adjust a location of stress in the panel member.

In another general aspect, a display device may include a flexible display having a substantially flat portion and an end portion, a printed circuit film disposed on the end portion of the display, a panel member attached to the printed circuit film, the panel member being bent around a bend axis to form an edge of the display, a support structure disposed inside of the panel member, the support structure includes an elongated body portion and a rounded end portion, the elongation portion being non-parallel to the flat portion of the display. The panel member may conform to a shape of the elongated portion and the rounded end portion of the support structure.

DETAILED DESCRIPTION

Figure 1A:
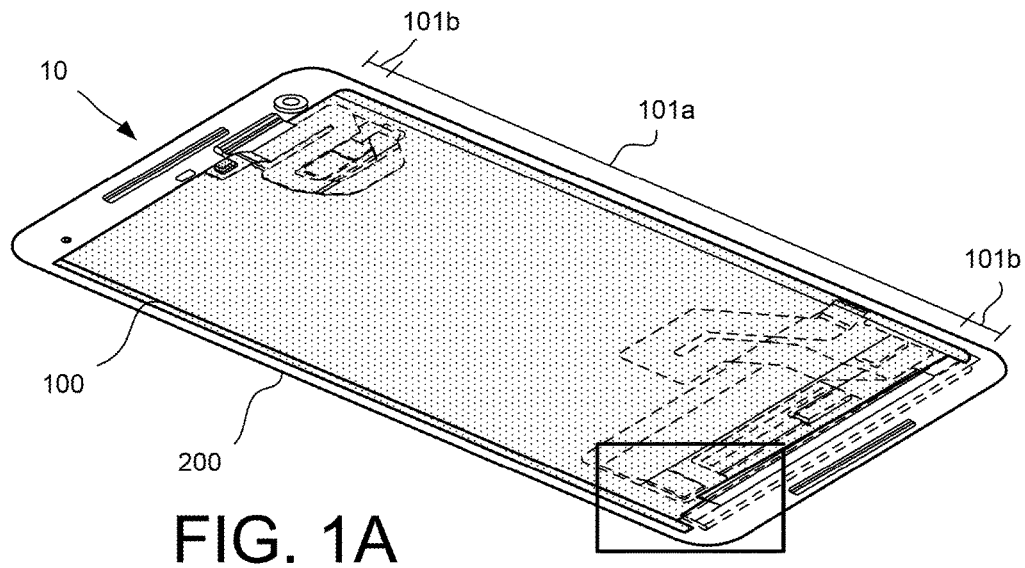
FIG. 1A illustrates a schematic view of an exemplary display device according to an example embodiment.

While example embodiments may include various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Furthermore, the figures are intended to illustrate the general characteristics of methods and/or structure utilized in certain example embodiments and to supplement the written description provided below. These figures are not, however, to scale and may not precisely reflect the precise structural or performance characteristics of any given embodiment, and should not be interpreted as defining or limiting the range of values or properties encompassed by example embodiments. For example, the structural elements may be reduced or exaggerated for clarity. The use of similar or identical reference numbers in the various drawings is intended to indicate the presence of a similar or identical element or feature.

Figure 6:
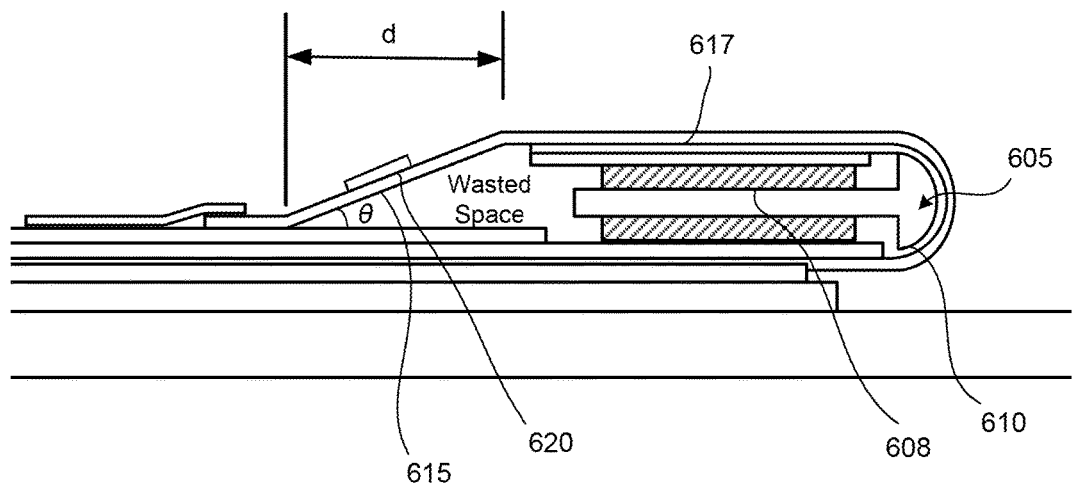
FIGS. 6 and 7 are cross-sectional views of conventional display devices.
Figure 7:
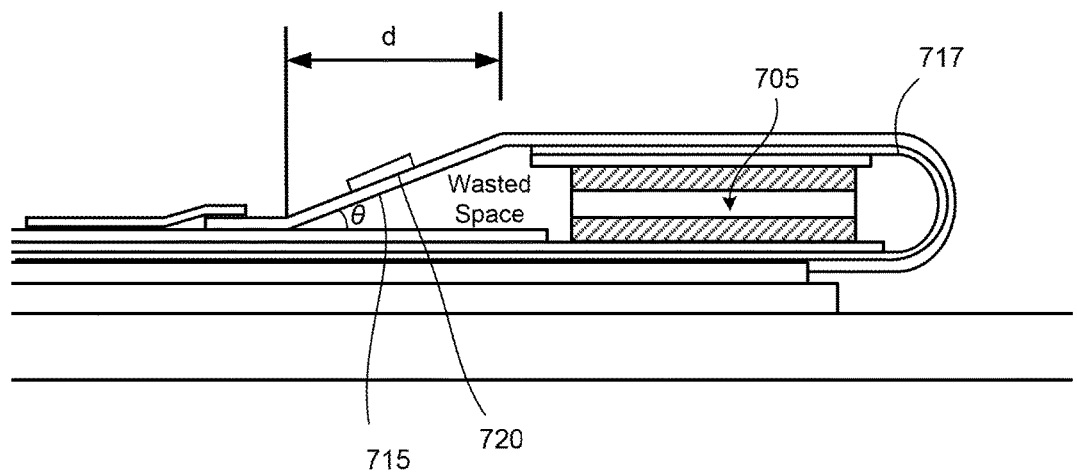

Conventional flexible display devices (e.g., flexible organic light-emitting diodes (OLED) displays) may include a support structure, which may be referred to as a mandrel, in a bend portion of the display to form the bend and minimize a border size of the display module bottom. The support structure in conventional flexible display devices has a constant (e.g., uniform) thickness. For instance, FIG. 6 illustrates a conventional support structure 605 having an elongated portion 608 with a uniform thickness and a rounded portion 610. FIG. 7 illustrates another conventional support structure 705 made of foam, for example, having a uniform thickness. In such conventional devices, a printed circuit film 615 (or 715), such as, for example, a chip-on-film (COF) bonded to a panel member 617 (or 717) may not be able to conform to a backside of the panel member 617 (or 717) until the printed circuit film 615 (or 715) passes the support structure (605 or 705). As a result, there is unnecessary space underneath a region where the printed circuit film 615 (or 715) occupies. In other words, the printed circuit film 615 (or 715) may not be able to bend downward aggressively to avoid metal trace crack in the printed circuit film 615 (or 715). It thus requires a long horizontal distance 'd' to bend the printed circuit film 615 (or 715). This leads to a void space under the printed circuit film 615 (or 715), which is considered wasted space. In addition, the conventional flexible display device may include a display driver integrated circuit (D-IC) 620 (or 720) on the printed circuit film 615 (or 715) above the wasted space region. As a result, the display driver integrated circuit 620 (or 720) is not well constrained and can easily move during dynamic mechanical events, such as, for example, shock, vibration, drop, and etc. Such movement could also lead to crack in the display driver integrated circuit 620 (or 720). Moreover, movement of the display driver integrated circuit 620 (or 720) can also lead to collision with other components and may cause damage.

In order to resolve the above issues, exemplary support members as described herein may be variable (e.g., uneven, non-uniform, etc.). In other words, the support member has a thickness that is non-linear. To describe in another manner, at least one of the surfaces of the support member is non-parallel to a surface in a flat planar portion of the display, for example. While the exemplary support members can maintain a same panel member bend radius as conventional displays, the printed circuit film may be attached to the display at a desired location (e.g., shorter distance "d") due to the thickness of the support member decreasing (e.g., farther away from the bend radius). That is, the printed circuit film may conform to a shape of the support member. Thus, this result in a downward bending of the printed circuit film to start earlier, which may create an angle of attachment of the printed circuit film with the display to be less aggressive. Further, wasted space is minimized, and it will leave more space for other components such as, for example, a battery. Moreover, by permitting the downward bending of the printed circuit film to commence earlier, components, such as, for example, a display driver integrated circuit (attached on the printed circuit film) may be located in a fixed area of the printed circuit film, rather than underneath the wasted space region, which may cause the display driver integrated circuit to move. This provides stability and improved performance of the display driver integrated circuit. Furthermore, cracking of the display driver integrated circuit and/or flex metal track crack can be avoid and/or reduced. Also, collision with other components can be avoided and/or reduced.

Further, it may be desirable to bend the panel member to be positioned behind the display (e.g., folded under the display), thereby reducing or eliminating the visible display borders and wasted space inside of the display. Not only does the bending of the panel member minimize an area size to be hidden from view, but it will also open possibility to various new display device designs.

FIG. 1A illustrates a schematic view of an exemplary electronic device according to an example embodiment. The electronic device 10 may be a computing device such as a laptop computer, a tablet computer, a cellular telephone, a media player, or other handheld or portable electronic device, such as a wrist-watch device. Other configurations may be used for electronic device 10 if desired. The example of FIG. 1A is merely illustrative.

The electronic device 10 may include a display 100 mounted in a housing 200 (e.g., enclosure or casing) of the electronic device 10. The housing 200 may be formed of plastic, metal (e.g., stainless steel, aluminum, etc.), glass, ceramics, rubber, or other suitable materials, or combination of materials. The housing 200 may be formed by injection molding or formed using multiple structures.

The display 100 may include an active area 101a (e.g., display area), in which an array of pixels (not shown) are formed therein, and non-display areas 101b. As illustrated in the exemplary embodiment shown herein, the display 100 may be rectangular shaped. Other shapes may be employed, and not limited to the exemplary embodiment described herein. The non-display area 101b may be provided at a periphery of the display area 101a at least one end. That is, the display area 101a may be disposed adjacent to at least one side end of the display area 101a. For example, the non-display area 101b may be formed on at least one shorter side of the display 100. As illustrated in the exemplary embodiment described herein, the non-display area 101b may be formed on both shorter sides of the display area 101a. In some implementations, the arrangement of the non-display area 101b adjacent to the display area 101a is not particularly limited as the exemplary display 100 illustrated in FIGS. 1A and 1B.

Each display pixel may include a light-emitting element (not shown), for instance, an organic light-emitting diode (OLED), and pixel circuit. Each display pixel in the display area 101a may be associated with a pixel circuit, which may include at least one switching thin-film transistor (TFT) and at least one driving TFT on the display 100. Further, each pixel circuit may be electrically connected to a gate line and a data line to communicate with one or more driving circuits, such as a gate driver and a data driver positioned in the non-display area 101b of the display 100. For example, one or more driving circuits can be implemented with TFTs in the non-display area 101b. There may be any suitable number of rows and columns of pixels in the display 100 (e.g., tens or more, hundreds or more, or thousands or more).

In some implementations, TFTs may be polysilicon thin-film transistors, semiconducting-oxide thin-film transistors, such as indium zinc gallium oxide transistors, or thin-film transistors formed from other semiconductors.

Figure 1B:
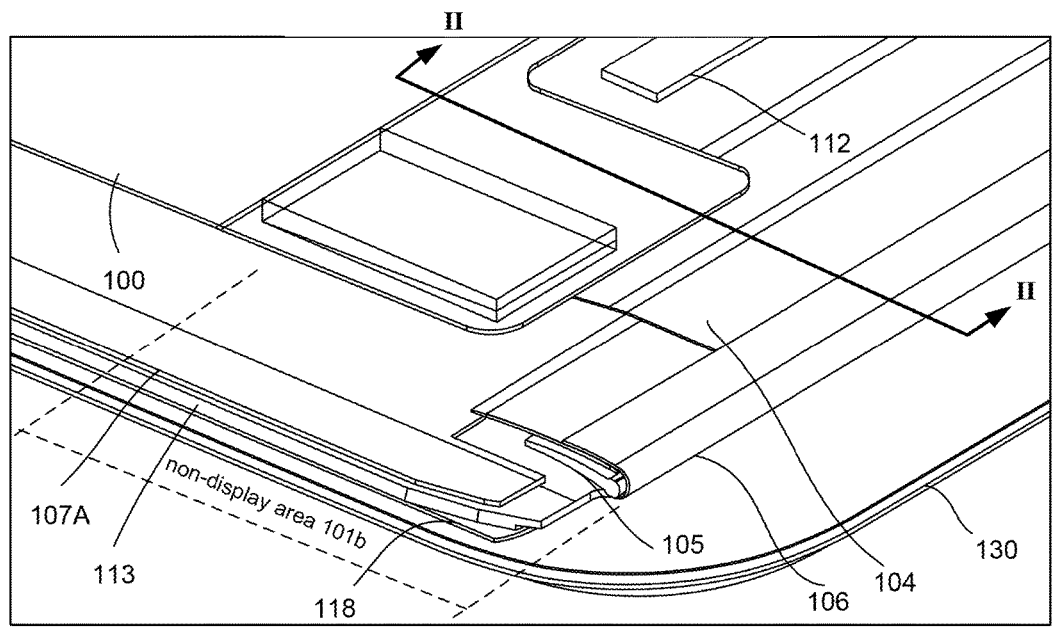
FIG. 1B is a detailed view of a portion of an exemplary display device of FIG. 1A.

As shown in FIG. 1B, which is a detailed view of a portion of the electronic device 10, the display 100 may further include additional components for generating a variety of signals for operating the pixels in the display area 101a. For example, the component may be a display driver integrated circuit (D-IC) 112. The display driver integrated circuit 112 may be mounted on a separate printed circuit disposed in the non-display area 101b using a printed circuit film 104, such as, for example, a chip-on-film (COF). As will be described in further detail below, the non-display area 101b can be bent away from the display area 101a so that layers (or components) in the non-display area 101b may be positioned at a rear side of the display 100 to reduce the size of the non-display area 101b. Other non-limiting examples of components for operating the pixels may be an inverter circuit, a multiplexer, an electro-static discharge (ESD) circuit, a power supply unit, and/or the like.

In some implementations, metal interconnect structures may be used to interconnect TFTs and other components in the circuitry. For example, metal interconnect lines may be used to route signals to data lines and gate lines, to contact pads (e.g., contact pads coupled to gate driver circuitry), and to other circuitry in the display 100. In one example implementation, the metal interconnect structure may be metal traces in the printed circuit film 104 connecting the TFTs in the display area 101a to the display driver integrated circuit (D-IC) 112 in the non-display area 101b.

In some implementations, the printed circuit film 104 may further be a flexible printed circuit board (FPCB), a tape-carrier-package (TCP) or any other suitable technologies.

In some implementations, the display 100 may also include components associated with functionalities other than for operating the pixels of the display 100. For example, the display 100 may include components for providing a touch sensing functionality, a user authentication functionality (e.g., finger print scan), a multi-level pressure sensing functionality, a tactile feedback functionality and/or various other functionalities for the electronic device employing the display 100.

Figure 2:
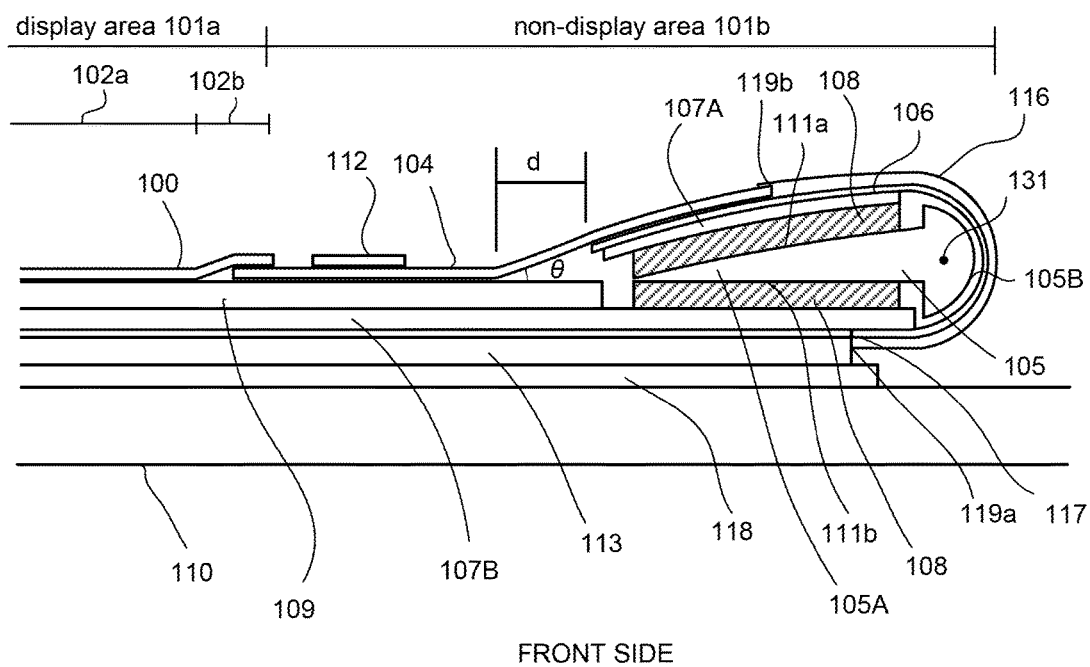
FIG. 2 is a cross-sectional view illustrating an exemplary display device of FIG. 1B.

FIG. 2 is a cross-sectional view illustrating an exemplary display 100 as illustrated in FIG. 1B. As shown in FIG. 2, the display 100 may have an outer display layer 110, such as a cover glass layer, to protect the display 100. The outer display layer 110 may be formed from a material such as, for example, sapphire, glass, plastic, clear ceramic, or other transparent material. A polarizer layer 113 may be interposed between the outer display layer 110 and the display 100. The polarizer layer 113 may help reduce light reflections from metal interconnection structure, such as metal traces in the TFT circuitry. The polarizer layer 113 may be in the display area 101a of the display and extend into the non-display area 101b of the display. A layer of optically clear adhesive (OCA) 118 may be used to attach the outer display layer 110 and the polarizer layer 113 together. The layer of optically clear adhesive 118 may also be in the display area 101a of the display and extend into the non-display area 101b of the display.

In some implementations, other layers may be interposed between the display 100 and the outer display layer 110. For example, a protective layer may be included to act as a moisture barrier structure, an encapsulant material, adhesive, and/or other materials to help protect TFT circuitry. In other implementations, a functional layer may be interposed between the display 100 and the outer display layer 110. For example, the functional layer may include a touch sensor layer, a user authentication layer (e.g., finger print scan), a multi-level pressure sensor layer, a tactile feedback layer, and/or other various functional layer(s). These layers can be placed in the display area 101a and/or in the non-display area 101b. In some implementations, the functional layers may be provided on a separate printed circuit that is connected to the display 100.

The display area 101a of the display 100 may include a planar central portion 102a and an end portion 102b. The planar central portion 102a may be a planar active area portion that includes the active area of the display 100 that is formed with an array of pixels. The term "planar" herein means that a surface of the display is lying in one plane (e.g., flat or horizontal). At an end of the planar portion 102a, the end portion 102b is formed. The end portion 102b may bend upwards in relation to the planar portion 102a so that the printed circuit film 104 (e.g., COF) is underneath (attached below) the end portion 102b of the display 100.

On one side (e.g., front side) of the printed circuit film 104, a panel member 106 may be attached to the printed circuit film 104. The panel member 106 may be attached to the printed circuit film 104 by adhesive. For example, the adhesive may be a pressure sensitive adhesive, a foam adhesive, or other suitable adhesive.

In some implementations, the panel member 106 may be formed from plastic, such as, for example, polyimide or other flexible polymer and/or other suitable materials. The panel member 106 may be made from a flexible material sufficient to bend (e.g., folded under the display 100) to form an edge of the display. This helps minimize visible display borders and reduce wasted space inside of the display 100. The panel member 106 may be bent at a small bending radius. For example, the bending radius may be approximately 0.04 mm. Other bending radius may be employed depending on the design of the display.

In some implementations, the material of the panel member 106 may have sufficient elasticity to be bent around a bend axis 131 and not be subject to stress (i.e., compression and tensile stress). For instance, as shown in the cross-sectional side view of the illustrative display of FIG. 2, when the panel member 106 is bent around the bend axis 131, a leading end portion 117 of the panel member 106 is folded under the display 100 and hidden from view by a user.

On an outer side (e.g., rear side) of the panel member 106, a coating layer 116 may be attached to the panel member 106. The coating layer 116 may be used to adjust stress (e.g., compression or tensile) location in the display and avoid damage. Also, the coating layer 116 may be used to control the neutral plane within the stack, so that the neutral plane occurs at, or close to, fragile components of the display (e.g., TFTs, etc.). In some implementations, the coating layer 116 may have an elasticity that is at least the same or greater than the elasticity of the panel member 106. In some implementations, the coating layer 116 may be attached to the panel member 106 by adhesive. As described in the illustrative exemplary embodiment, the coating layer 116 similarly conforms to the shape as the panel member 106, and therefore, one end portion 119a of coating layer 116 may also be folded under the display 100 and hidden from view by the user. At the other end, end portion 119b of the coating layer 116 may be attached to an end portion of the printed circuit film 104. In some implementations, the two ends may be attached by adhesive. In order to provide a stronger bond and greater seal, the end portion 119 of the coating layer 116 may slightly overlap the end portion of the printed circuit film 104 and be bonded thereto.

An upper support layer 107A and a lower support layer 107B may be provided at underside of the panel member 106 to increase rigidity at a selective portion of the panel member 106 and/or display 100. In other words, the upper support layer 107A may be attached to one side (e.g., front side) of the panel member 106 and the lower support layer 107B may be attached to one side (e.g., rear side) of the panel member 106 in a bend portion of the non-display area 101b. The lower support layer 107B may also be provided on the display 100 (e.g., extend into the display area 101a of the display 100) to provide support for the display 100. For instance, the lower support layer 107B can be provided on an inner surface (e.g., front side) of the display 100 at the planar central portion 102a and the end portion 102b of the display 100 and extend into the non-display area 101b until the leading end portion 117 of the panel member 106 is attached to the lower support layer 107B. Besides increased rigidity at selective parts of the display 100, the support layers 107A, 107B may help in ensuring accurate configuration and placement of various components during manufacturing and use of the display 100.

In some implementations, there may be no upper support layer 107A and/or lower support layer 107B in the non-display area 101b, particularly, in a bend portion of the non-display area 101b, in order to provide more flexibility.

In some implementations, the support layers 107A, 107B may each be made of a thin plastic film formed from polyimide, polyethylene terephthalate (PET), or other flexible polymer and/or other suitable materials. In some implementations, the support layers 107A, 107B can be more rigid than the panel member 106. Other suitable materials that may be used to form the panel member 106 and/or the support layers 107A, 107B. For example, other suitable materials may include a thin glass, a metal foil covered with a dielectric material, a multi-layered polymer stack and a polymer composite film including a polymer material combined with nanoparticles or micro-particles dispersed therein. In some implementations, the support layers 107A, 107B provided in various parts of the display 100 need not be made of the same material. For example, a thin-glass layer may be used as the lower support layer 107B in the display area 101a of the display 100 while a thin plastic film layer may be used as the support layer 107B in non-display area 101b of the display 100.

To support the panel member 106 and maintain the curvature at the bend portion in the non-display area 101B, a support member 105, which may also be referred to as a "mandrel" may be attached to the panel member 106 in an inner space thereof. The panel member 106 may be attached to the support member 105 by an adhesive layer 108. For example, the adhesive layer 108 may be a pressure sensitive adhesive, a foam adhesive, a liquid adhesive, a light-cured adhesive or other suitable adhesive. The adhesive layer 108 may be interposed between the support member 105 and the upper and lower support layers 107B, 107B. In some implementations, the adhesive layer 108 may be a compressible material, such as, for example, a cushion layer.

In some implementations, the support member 105 may be formed of plastic material such as polycarbonate, polyimide, polyethylene naphthalate, polyethylene terephthalate, other suitable polymers, or a combination of these polymers. In some implementations, the support member 105 may also be formed of glass, ceramic, metal or other rigid materials or combinations of aforementioned materials.

In some implementations, the support member 105 may be formed by injection molding, 3D printing or other methods, that may form into desired shapes.

As shown in FIG. 2, the exemplary support member 105 may have an elongated body portion 105A and a rounded end portion 105B. The panel member 106 and the support member 105 may be arranged so that that the rounded end portion 105B of the support member 105 is positioned within the panel member 106 corresponding to the bend portion in the non-display area 101b. The size and the shape of the rounded end portion 105B of the support member 105 can vary depending on the minimum curvature desired at the bend portion in the non-display area 101b of the display 100.

In some implementations, the adhesive layer 108 can be placed on an upper surface 111a and/or a lower surface 111b of the elongated body portion 105A of the support member 105. In other words, when the bend portion of the panel member 106 wraps around the rounded end portion 105B of the support member 105, the adhesive layer 108 can be provided on both the upper surface 111a (e.g., a surface facing the rear side) and the lower surface 111b (i.e., a surface facing the front side) of the elongated body portion 105A.

In some implementations, the adhesive layer 108 may be provided between a surface of the rounded end portion 105A of the support member 106 and the inner surface of the panel member 106.

Depending on the shape of the support member 105, a thickness of the adhesive layer 108 on the upper and the lower surfaces 111a, 111b of the elongated body portion 105A can be different. For example, if the bend radius of the panel member 106 needs to be large, the thickness of the adhesive layer 108 can be small. On the other hand, if the bend radius of the panel member 106 needs to be minimum, the thickness of the adhesive layer 108 is large.

A shape of the elongated body portion 105A of the support member 105 may be variable (e.g., uneven, non-uniform, etc.). In other words, the elongated body portion 105A has a thickness that is non-linear and can be tapered. To describe in another manner, at least one of the surfaces of the elongated body portion 105A is non-parallel in relation to a surface in the flat planar portion 102a of the display 100, for example. As illustrated in the exemplary embodiment described herein, the elongated body portion 105A has a wedge-like shape such that the printed circuit film 104 attached to the panel member 106 may conform to the shape of the elongated body portion 105A. Furthermore, the shape of the elongated body portion 105A permits a downward bending (e.g., away from the bend radius 131) of the printed circuit film 104, which may be attached to the display 100 via a cushion layer 109, to be less aggressive (e.g., an angle θ at the bend is smaller). In other words, the downward bending of the printed circuit film 104 starts earlier (e.g. closer to the bend radius 131). In comparison to the conventional display illustrated in FIG. 6, the downward bending of the conventional printed circuit film 608 starts later and has a greater angle θ. This may also be shown by a comparison of distance "d", which may be a distance between an end portion of the panel member 106 to a location of bending of the printed circuit film 104 (e.g., location where the printed circuit film 104 is attached to the cushion layer 109 and bent). For instance, the distance "d" as shown in FIG. 2 is smaller as compared to the distance "d" shown in conventional art of FIG. 6. As a result, wasted space is minimized, and a compact display design can be achieved.

Furthermore, by permitting the downward bend of the printed circuit film 104 to commence earlier, components (e.g., display driver integrated circuit 112) attached on the printed circuit film 104 may be located in a fixed area of the printed circuit film 104. In other words, the display driver integrated circuit 112 may be located at a portion of the printed circuit film 104 where the printed circuit film 104 is attached to the cushion layer 109. This provides stability and improved performance of the display driver integrated circuit 112 (e.g., connections in the display driver integrated circuit 112 will be stable and will not move easily). Furthermore, the display driver integrated circuit 112 cracking and/or colliding with other components are reduced. In contrast, as shown in FIGS. 6 and 7, the conventional component (e.g., 620 or 720) is located on the printed circuit film (e.g., 620 or 720) that is floating (e.g., at a location where wasted space is underneath), and thus, stability and integrity of the component on the printed circuit film (620 or 720) may be compromised.

FIGS. 3A-3D illustrate schematic views of various other shapes of the support structure 105 according to exemplary embodiments.

Figure 3A:
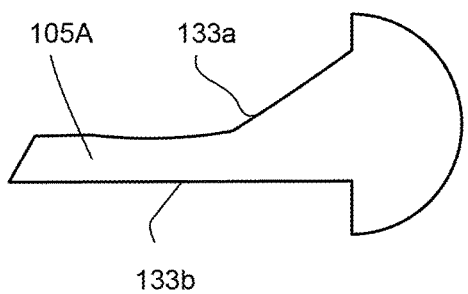
FIGS. 3A-3E are schematic views of a support structure according to example embodiments.

In some implementations, as shown in FIG. 3A, one surface of the elongated body portion 105A is non-linear (e.g., non-parallel with respect to other surface of the elongated body portion 105A or non-parallel with respect to a surface of the flat planar display 100). In other words, an entire one surface of the elongated body portion 105A is not straight (non-parallel) with respect to the other surface of the elongated body portion 105A. In this implementation, an upper surface 133a of elongated body portion 105A may be non-linear and a lower surface 133b of the elongated body portion 105A may be linear (e.g., straight). In other implementations, both the upper and lower surfaces 133a, 133b of the elongated body portion 105A may be non-linear. In some implementations, the non-linear upper surface may contain more than one straight surfaces (e.g., not in parallel with respect to each other).

Figure 3B:
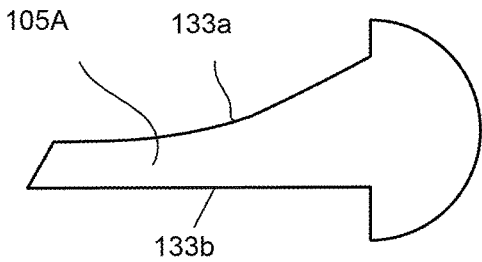

In some implementations, as shown in FIG. 3B, one surface of the elongated body portion 105A is curved. In this implementation, an upper surface 133a of the elongated body portion 105A may be curved and a lower surface 133b of the elongated body portion 105A may be linear (e.g., straight). In other implementations, both the upper and lower surfaces 133a, 133b of the elongated body portion 105A may be curved. In some implementations, the curved surface may be convex or concave.

Figure 3C:
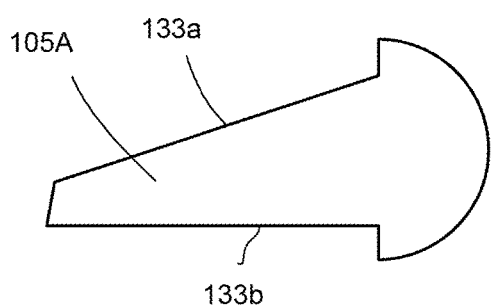

In some implementations, as shown in FIG. 3C, one surface of the elongated body portion 105A is linear (e.g., straight) but at an angle with respect to the other surface of the elongated body portion 105A. In other words, an upper surface 133a of the elongated body portion 105A may be at an angle with respect to a lower surface 133b of the elongated body portion 105A, which may be straight. That is, the upper surface and the lower surfaces are not in parallel with respect to each other. Described in another way, the elongated body portion 105A may have a trapezoidal shape.

Figure 3D:
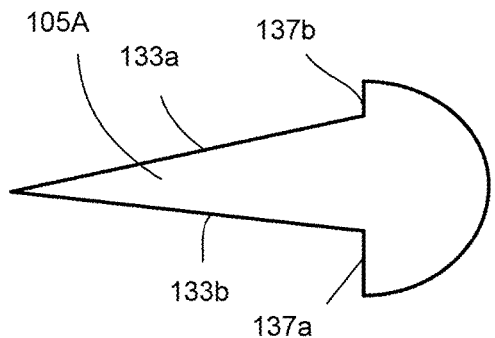

In some implementations, as shown in FIG. 3D, both upper and lower surfaces 133a, 133b of the elongated body portion 105A may be at an angle. In other words, the upper surface 133a and the lower surface 133b are not in parallel with respect to each other. Further, the elongated body portion 105A may not be at a center of the rounded end portion 105B of the support member 106. In this implementation, a distance of a surface 137a on one side of the rounded end portion 105B may be greater than a distance of a surface 137b, opposite the surface 137a, on the other side of the rounded end portion 105B.

Figure 3E:
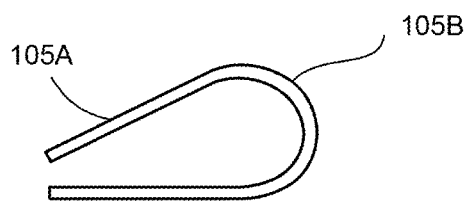

In some implementations, as shown in FIG. 3E, the support structure 105 may be formed of a folded thin sheet metal. For example, the sheet metal may be made from stainless steel. In this implementation, the folded edge of the sheet metal can serve as the rounded end portion 105B of the support member 105. Even when a sheet metal is used to form the support member, the rounded end portion 105B can have greater thickness than the elongated body portion 105A. That is, pressure can be applied on the part of the folded metal sheet for the elongated body portion 105A to make that portion thinner than the folded edge portion. In some implementations, the sheet metal may be formed by at least one of sheet metal forming, metal injection molding, die casting, machining or other methods.

Figure 4:
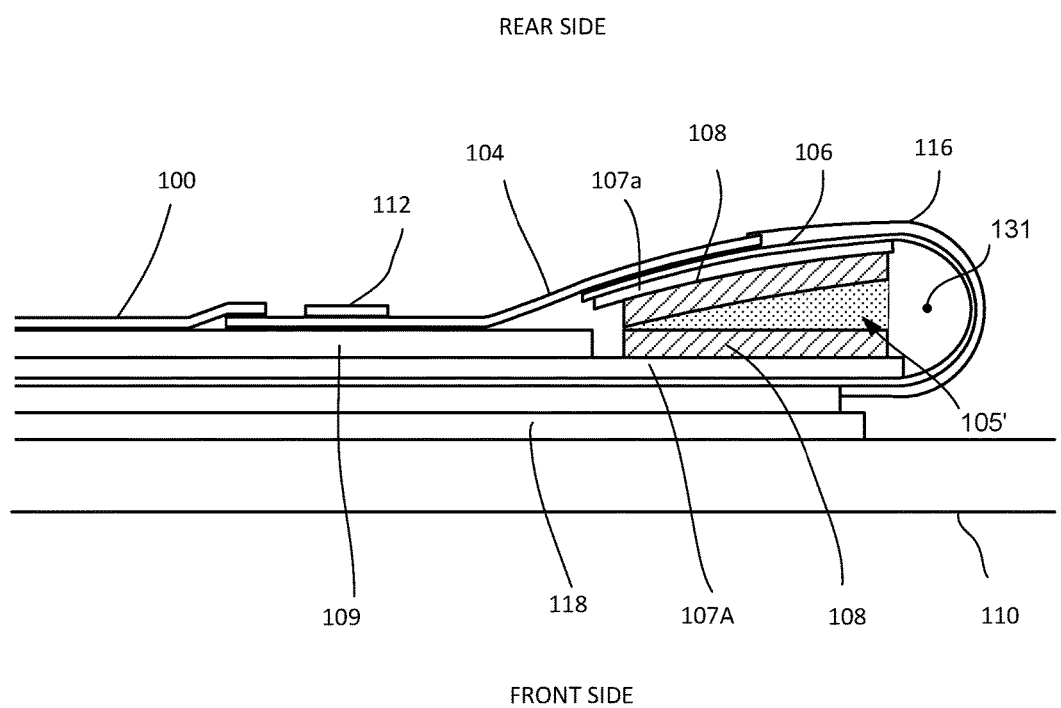
FIG. 4 is a cross-sectional view illustrating another exemplary display device according to example embodiments.

FIG. 4 is a cross-sectional view illustrating another exemplary display device according to example embodiments. The exemplary display device of FIG. 4 is substantially identical to the display device of FIG. 2 except for a support structure 105'. Therefore, similar components found in FIG. 2 will not be discussed further in detail in this section. It should further be appreciated that functions and/or operations of similar components will also not be discussed in detail in this section.

As shown in FIG. 4, the support structure 105' may have a similar shape as the support structure 105 of FIG. 2 except that there is no rounded portion. The support structure 105' may be attached to the panel member 106 by the adhesive layer 108. The adhesive layer 108 may be a pressure sensitive adhesive, for example. The adhesive layer 108 may have the same length as the support structure 105'. In other words, one end of the adhesive layer 108 may end at an end of the support structure 105'.

In order to help maintain a bend radius shape of the panel member 106, the support structure 105' may have a shape of a wedge. In other words, a thickness of the support structure 105' decreases as it goes farther away from the bend radius 131. Described in another way, neither of the surfaces of the support structure 105' is parallel to a surface of the planar portion of the display 100. As discussed above, this helps minimize the wasted space that may be created below the printed circuit film 104.

In some implementation, the support structure 105' may be made from foam, such as, for example, polyurethane foam, polyethylene foam, or other types of foam.

Figure 5A:
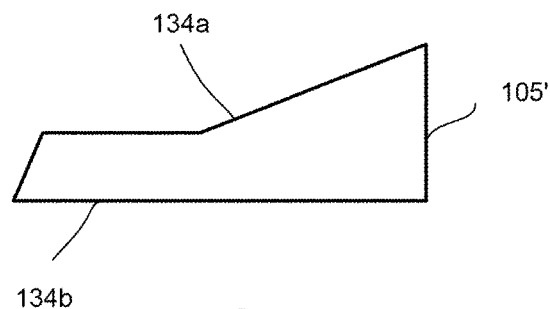
FIGS. 5A-5C are schematic views of a support structure according to example embodiments.
Figure 5B:
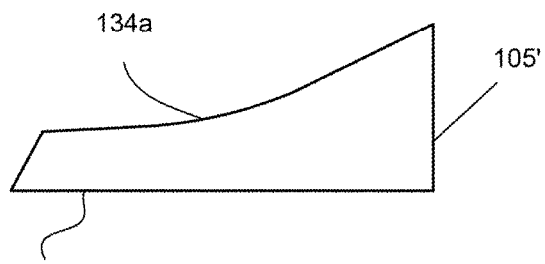
Figure 5C:
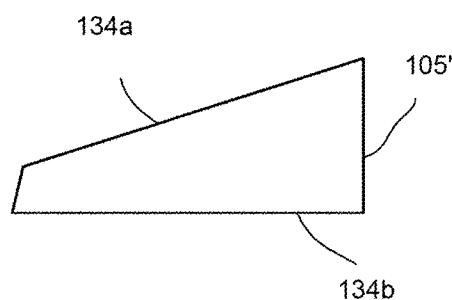

FIGS. 5A-5C illustrate schematic views of various other shapes of the support structure 105' according to exemplary embodiments.

In some implementations, as shown in FIG. 5A, one surface of the support structure 105' is non-linear (e.g., non-parallel with respect to other surface of the support structure 105' or non-parallel with respect to a surface of the flat planar display 100). In this implementation, an upper surface 134a of the support structure 105' may be non-linear and a lower surface 134b of the support structure 105' may be linear. In other implementations, both the upper and lower surfaces 134a, 134b of the support structure 105' may be non-linear. In some implementations, the non-linear upper surface may contain two or more straight surfaces (or non-straight surface) that are not in parallel direction.

In some implementations, as shown in FIG. 5B, one surface of the support structure 105' is curved. In this implementation, an upper surface 134a of the support structure 105' may be curved and a lower surface 134b of the support structure 105' may be linear. In other implementations, both the upper and lower surfaces of the support structure 105' may be curved. In some implementations, the curved surface may be convex or concave.

In some implementations, as shown in FIG. 5C, one surface of the support structure 105' is linear but at an angle with respect to the other surface of the support structure 105'. In other words, an upper surface 134a of support structure 105' may be at an angle with respect to a lower surface 134b of the support structure 105'. That is, the upper surface and the lower surface are not in parallel with respect to each other. Described in another way, the support structure 105' may be trapezoidal shaped.

In some implementations, the array of display pixels may be formed from liquid crystal display (LCD) components, an array of electrophoretic display pixels, an array of plasma display pixels, microelectromechanical (MEMS) shutter pixels, electrowetting pixels, micro-light-emitting diodes (small crystalline semiconductor die), quantum dot light-emitting diodes, or display pixels based on other display technologies.

Specific structural and functional details disclosed herein are merely representative for purposes of describing example embodiments. Example embodiments, however, may be embodied in many alternate forms and should not be construed as limited to only the embodiments set forth herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature in relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A display device, comprising:
   a display having a substantially flat central portion and an end portion;
   a printed circuit film including a first end portion and a second end portion, the first end portion being attached to the end portion of the display;
   a flexible panel member attached to the printed circuit film, the flexible panel member being bent around a bend axis to form an edge of the display;
   a coating member attached to a surface of the flexible panel member, one end of the coating member being attached to the second end portion of the printed circuit film; and
   a support structure disposed inside of the formed edge of the flexible panel member, the support structure having a tapered portion to bend the flexible panel member,
   wherein the flexible panel member conforms to a shape of the support structure.

2. The display device of claim 1, wherein the tapered portion of the support structure has a trapezoidal shape.

3. The display device of claim 1, wherein the support structure includes a first side surface and a second side surface, the second side surface being non-parallel to the first side surface.

4. The display device of claim 3, wherein one of the first side surface or the second side surface is curved.

5. The display device of claim 3, wherein one of the first side surface or the second side surface includes more than one surface.

6. The display device of claim 1, wherein the support structure is formed of a plastic material.

7. The display device of claim 6, wherein the plastic material is at least one of polycarbonate, polyimide, polyethylene naphthalate, polyethylene terephthalate, or a combination of polymers.

8. The display device of claim 1, wherein the support structure is formed of a metal material.

9. The display device of claim 1, wherein the support structure is formed of a foam material.

10. The display device of claim 1, further comprising an adhesive between the panel member and the support structure.

11. The display device of claim 10, wherein the adhesive is a pressure-sensitive adhesive.

12. The display device of claim 1, wherein the coating member conforms to a shape of the support structure.

13. A display device, comprising:
    a flexible display having a substantially flat central portion and an end portion, the flat central portion including a first end portion and a second end portion defining a longitudinal line;
    a printed circuit film attached to the display;
    a panel member attached to the printed circuit film, the panel member being bent around a bend axis to form an edge of the display;
    a support structure disposed inside of the formed edged of the panel member, the support structure includes an elongated body portion and a rounded end portion, the elongated body portion including a first side surface and a second side surface, the first side surface being parallel to the longitudinal line and the second side surface being non-parallel to the longitudinal line,
    wherein the panel member conforms to a shape of the elongated body portion and the rounded end portion of the support structure.

14. The display device of claim 13, wherein the second side surface of the elongated body portion is curved.

15. The display device of claim 13, wherein the second side surface of the elongated body portion includes at least two surfaces.

16. The display device of claim 13, wherein the printed circuit film includes a flat portion and a curved portion, the curved portion being at a non-zero angle with respect to the flat portion.

17. The display device of claim 16, further comprising a display driver integrated circuit device, the display driver integrated circuit device being disposed on the flat portion of the printed circuit film.

18. The display device of claim 13, further comprising an adhesive between the panel member and the support structure.

19. The display device of claim 16, wherein the adhesive is disposed on the elongated body portion of the support structure.

20. The display device of claim 18, wherein the adhesive is a pressure-sensitive adhesive.

* * * * *